United States Patent
Nishimaki et al.

(10) Patent No.: US 10,585,353 B2
(45) Date of Patent: Mar. 10, 2020

(54) RESIST UNDERLAYER FILM FORMING COMPOSITION

(71) Applicant: NISSAN CHEMICAL CORPORATION, Tokyo (JP)

(72) Inventors: Hirokazu Nishimaki, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/302,603

(22) PCT Filed: May 2, 2017

(86) PCT No.: PCT/JP2017/017272
§ 371 (c)(1),
(2) Date: Nov. 16, 2018

(87) PCT Pub. No.: WO2017/199768
PCT Pub. Date: Nov. 23, 2017

(65) Prior Publication Data
US 2019/0294046 A1 Sep. 26, 2019

(30) Foreign Application Priority Data
May 20, 2016 (JP) .................................. 2016-101585

(51) Int. Cl.
*H01L 21/308* (2006.01)
*G03F 7/11* (2006.01)
(Continued)

(52) U.S. Cl.
CPC .................. *G03F 7/11* (2013.01); *C08G 8/00* (2013.01); *C08G 8/04* (2013.01); *C09D 161/06* (2013.01);
(Continued)

(58) Field of Classification Search
CPC ..... G03F 7/11; G03F 7/16; G03F 7/09; C08G 8/04; H01L 21/3213; H01L 21/308; H01L 21/306; C09D 161/12
See application file for complete search history.

(56) References Cited

U.S. PATENT DOCUMENTS

| | | | | |
|---|---|---|---|---|
| 2013/0189533 A1* | 7/2013 | Okuyama | .............. | G03F 7/091 428/524 |
| 2015/0212418 A1* | 7/2015 | Nishimaki | .............. | C08G 8/04 438/703 |

FOREIGN PATENT DOCUMENTS

| | | |
|---|---|---|
| JP | 2014-024831 A | 2/2014 |
| JP | 2014-528095 A | 10/2014 |
| WO | 2010/147155 A1 | 12/2010 |
| WO | 2013/146670 A1 | 10/2013 |
| WO | 2014/024836 A1 | 2/2014 |

OTHER PUBLICATIONS

Jul. 18, 2017 International Search Report issued in International Patent Application No. PCT/JP2017/017272.
Jul. 18, 2017 Written Opinion of the International Searching Authority issued in International Patent Application No. PCT/JP2017/017272.

* cited by examiner

*Primary Examiner* — Brian Turner
(74) *Attorney, Agent, or Firm* — Oliff PLC

(57) ABSTRACT

There is provided a novel resist underlayer film forming composition comprising a polymer having a repeating structural unit of formula (1a) and/or (1b):

(1a)

(Continued)

-continued

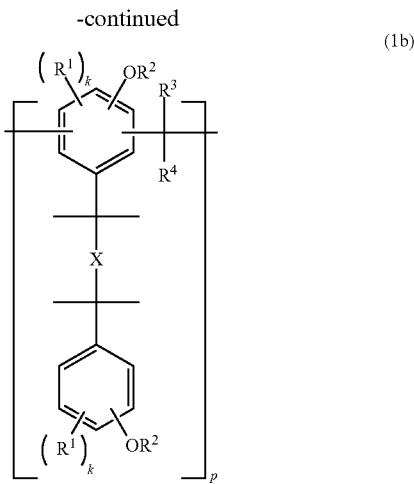

(1b)

[wherein two $R^1$s are each independently a $C_{1-10}$ alkyl group, a $C_{2-6}$ alkenyl group, an aromatic hydrocarbon group, a halogen atom, a nitro group, or an amino group, two $R^2$s are each independently a hydrogen atom, a $C_{1-10}$ alkyl group, a $C_{2-6}$ alkenyl group, an acetal group, an acyl group, or a glycidyl group, $R^3$ is an aromatic hydrocarbon group optionally having a substituent or a heterocyclic group, $R^4$ is a hydrogen atom, a phenyl group, or a naphthyl group, two ks are each independently 0 or 1, m is an integer of 3 to 500, p is an integer of 3 to 500, X is a benzene ring, and two —C(CH$_3$)$_2$— groups bonded to the benzene ring are in a meta position or a para position], and a solvent.

6 Claims, 1 Drawing Sheet

(51) Int. Cl.
| | | |
|---|---|---|
| H01L 21/306 | (2006.01) |
| C09D 161/12 | (2006.01) |
| G03F 7/038 | (2006.01) |
| G03F 7/32 | (2006.01) |
| C08G 8/04 | (2006.01) |
| C09D 161/06 | (2006.01) |
| H01L 21/02 | (2006.01) |
| H01L 21/027 | (2006.01) |
| H01L 21/311 | (2006.01) |
| C08G 8/00 | (2006.01) |
| G03F 7/16 | (2006.01) |

(52) U.S. Cl.
CPC .............. *G03F 7/16* (2013.01); *H01L 21/027* (2013.01); *H01L 21/0276* (2013.01); *H01L 21/02118* (2013.01); *H01L 21/02282* (2013.01); *H01L 21/31138* (2013.01); *H01L 21/31144* (2013.01); *G03F 7/162* (2013.01)

[FIG. 1]
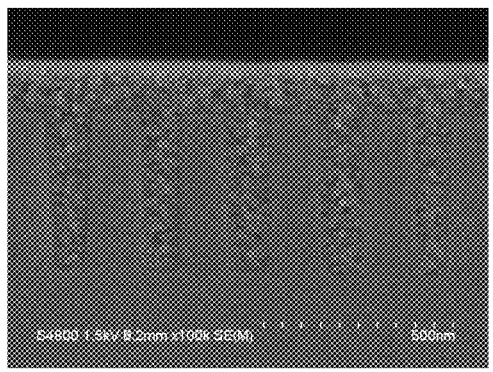
[FIG. 2]
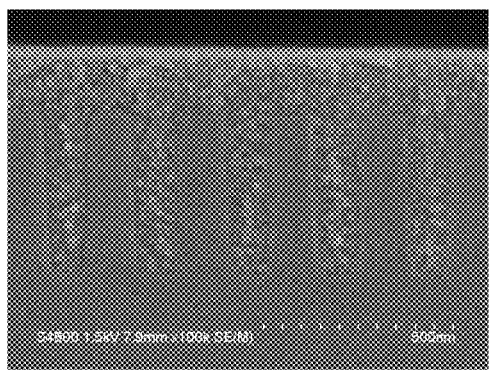
[FIG. 3]
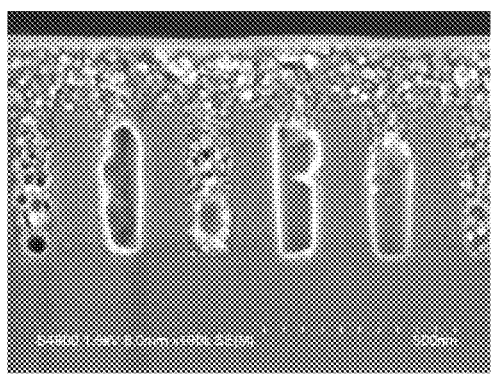

RESIST UNDERLAYER FILM FORMING COMPOSITION

TECHNICAL FIELD

The present invention relates to a resist underlayer film forming composition for a lithography process. In particular, the present invention relates to a composition for forming a resist underlayer film having etching resistance during use as a mask material and embeddability for a surface having steps, concave portions, and/or convex portions.

BACKGROUND ART

In production of a semiconductor device, fine processing by a lithography process is carried out. A problem about the lithography process has been known in which a resist pattern having a desired form is not formed during exposure of a resist layer on a substrate with an ultraviolet light laser such as a KrF excimer laser and an ArF excimer laser due to the influence of a standing wave that is caused by reflection of light from the ultraviolet light laser on a surface of the substrate. In order to solve the problem, a resist underlayer film (anti-reflective coating) provided between the substrate and the resist layer is used. Use of a novolac resin as a composition for forming the resist underlayer film is known (Patent Documents 1, 2, 3, and 4).

A lithography process has been also known in which a resist underlayer film of at least two layers is formed and used as a mask material for a decrease in film thickness of a resist layer that is required due to miniaturization of a resist pattern. Examples of materials for forming the at least two layers include an organic resin (e.g., acrylic resin and novolac resin), a silicon resin (e.g., organopolysiloxane), and an inorganic silicon compound (e.g., SiON and $SiO_2$). During dry etching using a pattern formed from the organic resin as a mask, the pattern needs to have resistance to etching using an etching gas (e.g., fluorocarbon). Patent Documents 1, 2, and 3 disclose an organic resin that is capable of forming such a pattern and has embeddability.

PRIOR ART DOCUMENTS

Patent Documents

Patent Document 1: Japanese Patent Application Publication No. 2014-24831 (JP 2014-24831 A)
Patent Document 2: International publication WO 2014/024836
Patent Document 3: International publication WO 2013/146670
Patent Document 4: International publication WO 2010/147155

SUMMARY OF THE INVENTION

Problem to be Solved by the Invention

In order to produce a semiconductor device, methyl 2-hydroxyisobutyrate is used as a solvent in processes such as a pre-wetting process (wetting of a surface of a substrate before application of a compound), edge rinsing (removal of a composition remaining at a periphery of a substrate), and back rinsing (removal of a compound remaining on a backside of a substrate), which are involved in application of a resist underlayer film forming composition. However, when the solubility of the resist underlayer film forming composition in methyl 2-hydroxyisobutyrate is low, a drain pipe connected to a coater which was used for application of the resist underlayer film forming composition to a substrate is clogged during continuousely use of the coater for application of methyl 2-hydroxyisobutyrate. As a result, a problem in which drainage cannot be discharged may occur. This problem is caused by attachment of a deposition of the resist underlayer film forming composition that is produced by mixing the resist underlayer film forming composition with methyl 2-hydroxyisobutyrate, in the pipe.

An object of the present invention is to provide a resist underlayer film forming composition that is dissolved in methyl 2-hydroxyisobutyrate. Another object of the present invention is to provide a composition for forming a resist underlayer film having excellent resistance to etching using an etching gas such as fluorocarbon, as compared with a conventional composition, and embeddability for a surface having steps, concave portions, and/or convex portions.

Means for Solving the Problems

A first aspect of the present invention is a resist underlayer film forming composition comprising a polymer having a repeating structural unit of formula (1a) and/or (1b):

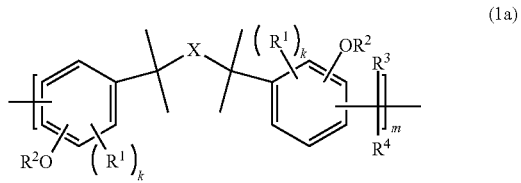

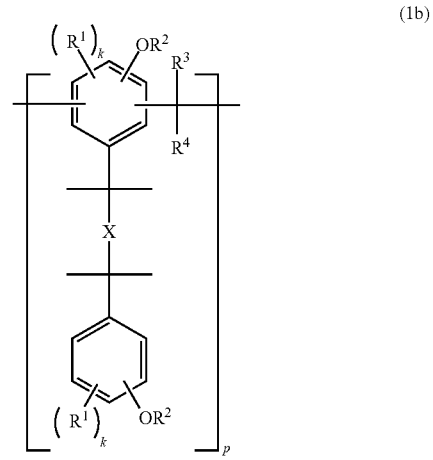

[wherein two $R^1$s are each independently a $C_{1-10}$ alkyl group, a $C_{2-6}$ alkenyl group, an aromatic hydrocarbon group, a halogen atom, a nitro group, or an amino group, two $R^2$s are each independently a hydrogen atom, a $C_{1-10}$ alkyl group, a $C_{2-6}$ alkenyl group, an acetal group, an acyl group, or a glycidyl group, $R^3$ is an aromatic hydrocarbon group optionally having a substituent or a heterocyclic group, $R^4$ is a hydrogen atom, a phenyl group, or a naphthyl group, when $R^3$ and $R^4$ bonded to the same carbon atom are each a phenyl group, $R^3$ and $R^4$ may be bonded to each other to form a fluorene ring, two ks are each independently 0 or 1, m is an integer of 3 to 500, p is an integer of 3 to 500, X is a benzene ring, and two —$C(CH_3)_2$— groups bonded to the benzene ring are in a meta position or a para position], and a solvent.

The polymer necessarily has the repeating structural unit of formula (1a), and optionally has the repeating structural unit of formula (1b).

When $R^1$s are a halogen atom, examples of the halogen atom include a chlorine atom and a bromine atom. The aromatic ring of the aromatic hydrocarbon group may be a monocycle, a polycycle (containing a dicycle), or a heterocycle.

Examples thereof include phenyl group, biphenyl group, naphthyl group, anthryl group, pyrenyl group, thienyl group, and pyridyl group. From the viewpoint of etching resistance and embeddability, it is preferable that the aromatic hydrocarbon group optionally having a substituent of $R^3$ be a phenyl group, a naphthyl group, an anthryl group, and a pyrenyl group. Examples of the substituent of the aromatic hydrocarbon group include methoxy group and aldehyde group.

The resist underlayer film forming composition of the present invention may further contain as an optional component at least one of a crosslinker, an acidic compound, a thermal acid generator, and a surfactant.

A second aspect of the present invention is a method for producing a semiconductor device comprising steps of: applying the resist underlayer film forming composition of the present invention to a surface of a substrate having steps, concave portions, and/or convex portions followed by baking, to form a first resist underlayer film; forming an organopolysiloxane film as a second resist underlayer film on the first resist underlayer film; forming a resist pattern on the second resist underlayer film; etching the second resist underlayer film using the resist pattern as a mask, etching the first resist underlayer film using the pattern of the etched second resist underlayer film as a mask; and etching the surface having steps, concave portions, and/or convex portions using the pattern of the etched first resist underlayer film as a mask.

In the step of forming the first resist underlayer film and/or the step of forming the second resist underlayer film, the substrate having steps, concave portions, and/or convex portions may be further subjected to a pre-wetting process, edge rinsing, and back rinsing using methyl 2-hydroxyisobutyrate.

Effects of the Invention

A resist underlayer film formed from the resist underlayer film forming composition of the present invention has resistance to etching using an etching gas such as fluorocarbon and excellent embeddability for a surface having concave portions and/or convex portions. Further, the resist underlayer film forming composition of the present invention is dissolved in methyl 2-hydroxyisobutyrate, and thus attachment of a deposition in a drain pipe connected to a coater is suppressed. Therefore, the resist underlayer film forming composition of the present invention can solve the problem in which the pipe is clogged.

BRIEF DESCRIPTION OF THE DRAWINGS

FIG. 1 is a cross-sectional SEM photograph illustrating a result of an embedding test using a resist underlayer film forming composition prepared in Example 1.

FIG. 2 is a cross-sectional SEM photograph illustrating a result of an embedding test using a resist underlayer film forming composition prepared in Example 2.

FIG. 3 is a cross-sectional SEM photograph illustrating a result of an embedding test using a resist underlayer film forming composition prepared in Comparative Example 2.

MODES FOR CARRYING OUT THE INVENTION

Examples of a structural unit of the polymer having a repeating structural unit of formula (1a) in the resist underlayer film forming composition of the present invention include structural units of the following formulae (1-1) to (1-24). Examples of a structural unit of the polymer having a repeating structural unit of formula (1b) include structural units of the following formulae (1-25) to (1-48).

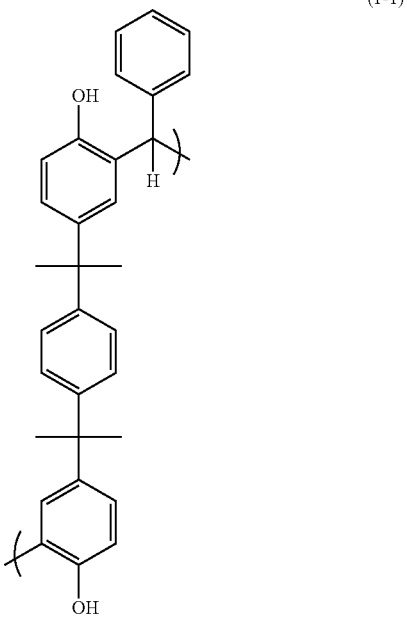

(1-1)

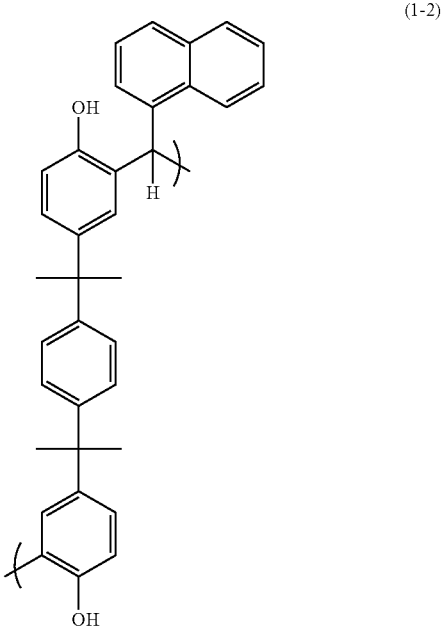

(1-2)

(1-3)
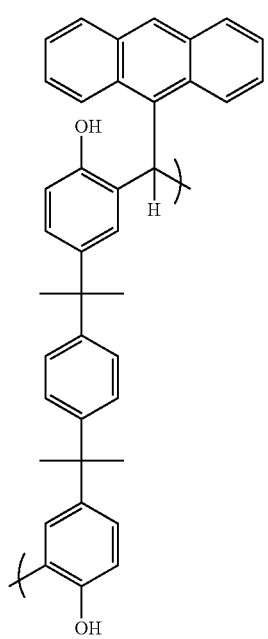
(1-4)
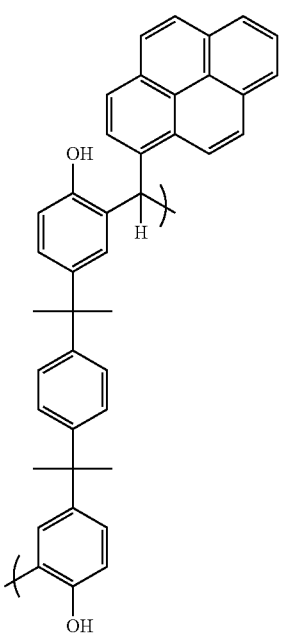
(1-5)
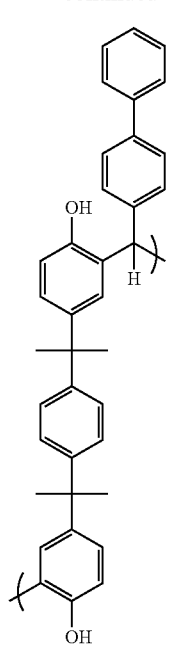
(1-6)
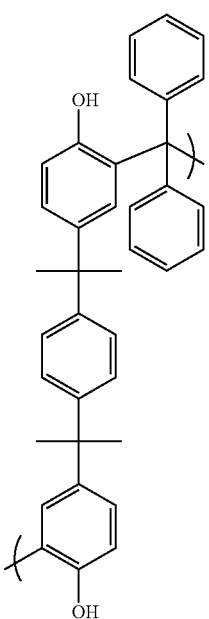

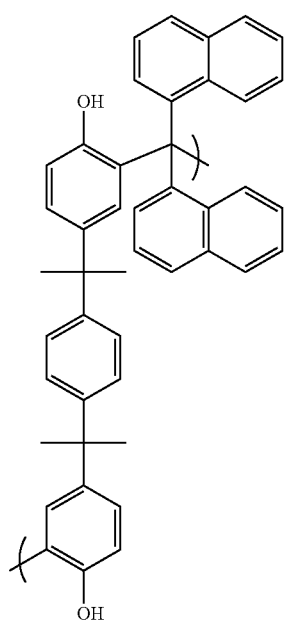
(1-7)
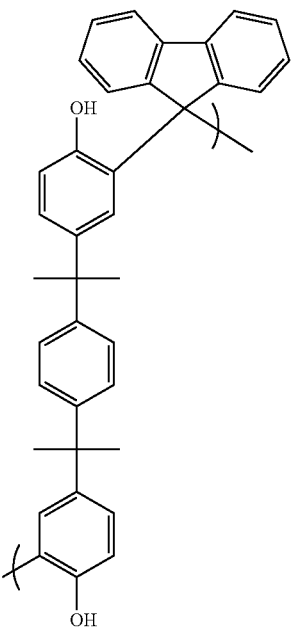
(1-8)
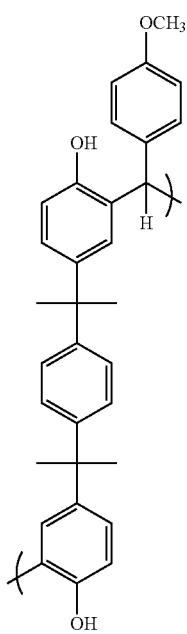
(1-9)
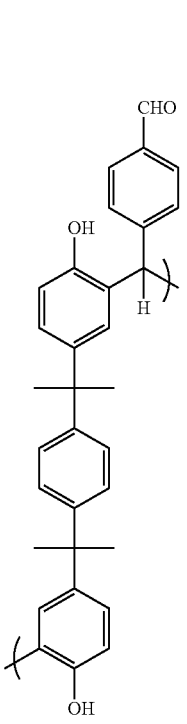
(1-10)

(1-11)
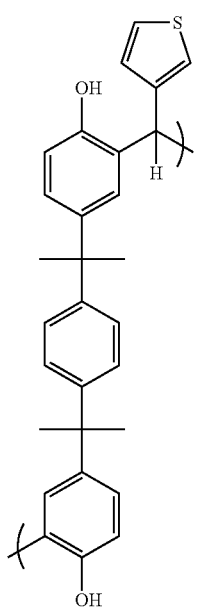
(1-12)
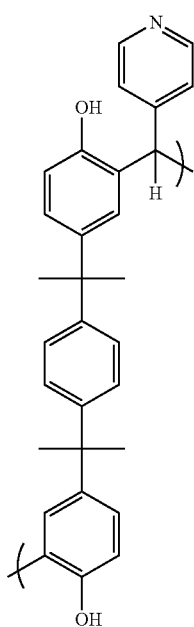
(1-13)
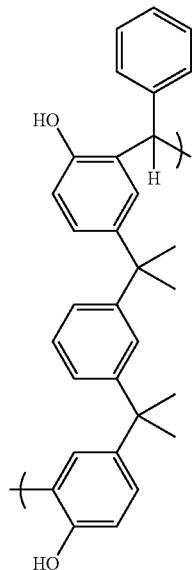
(1-14)
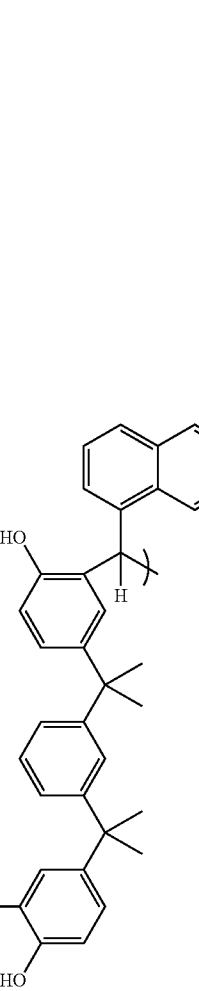

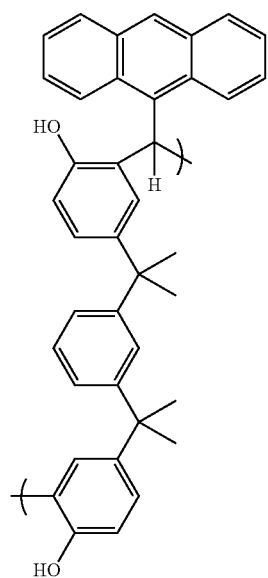
(1-15)
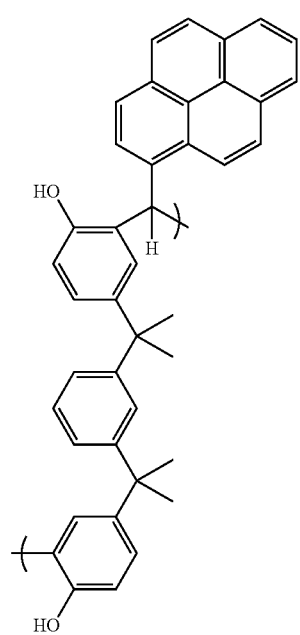
(1-16)
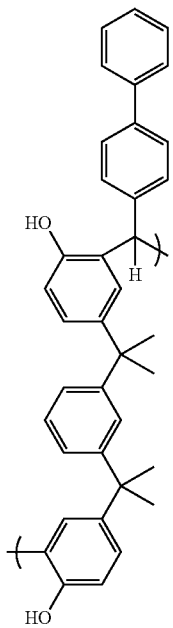
(1-17)
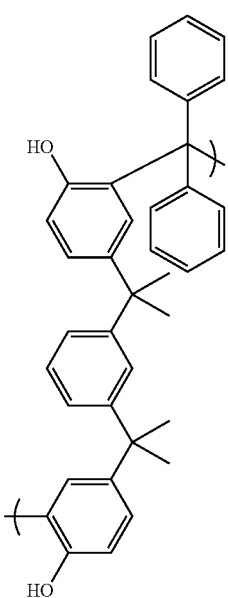
(1-18)

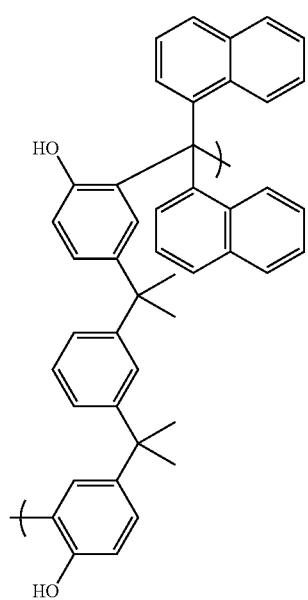
(1-19)
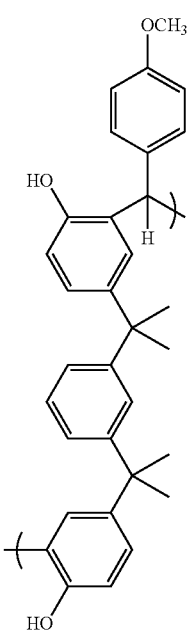
(1-21)
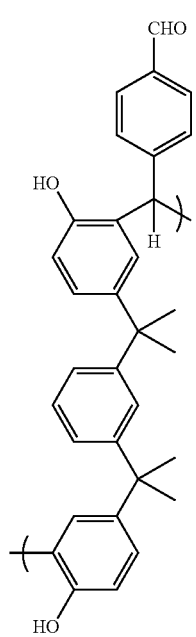
(1-22)
(1-20)

(1-23)
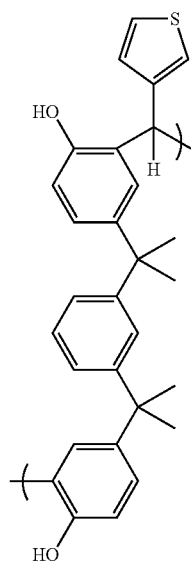
(1-24)
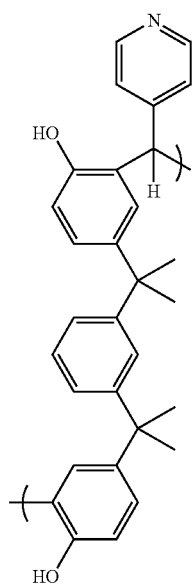
(1-25)
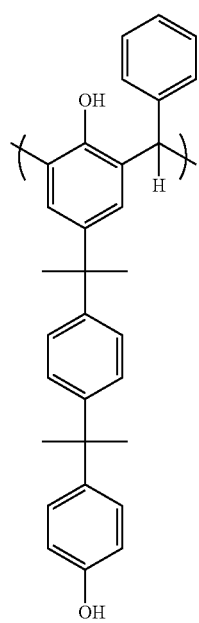
(1-26)
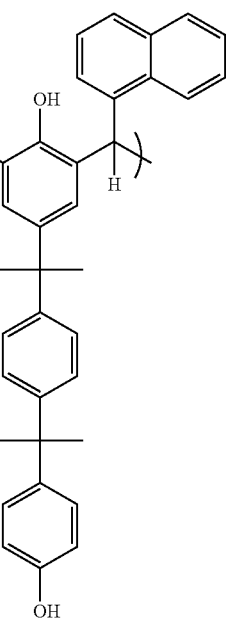

(1-27)
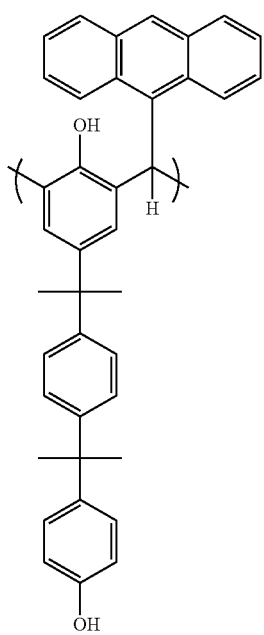
(1-28)
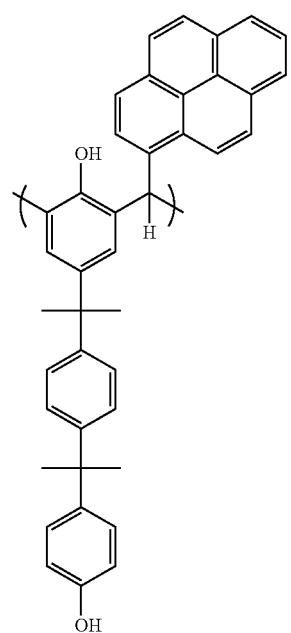
(1-29)
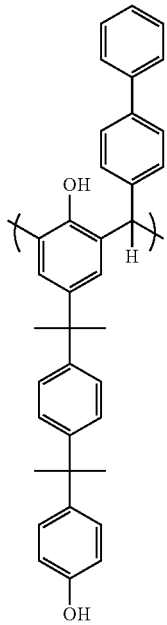
(1-30)
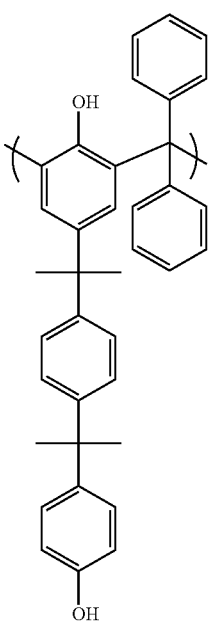

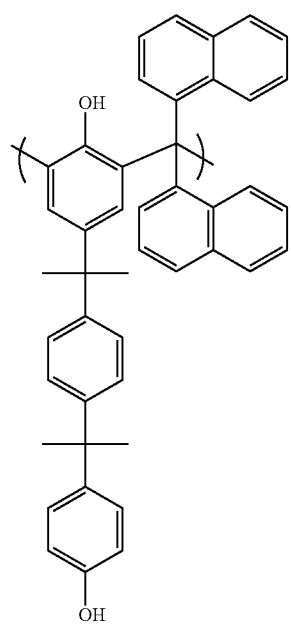
(1-31)
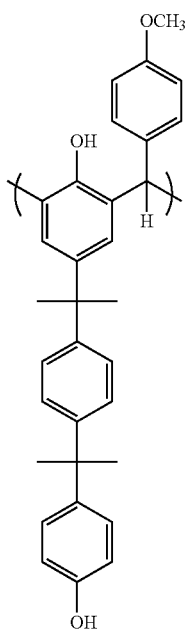
(1-33)
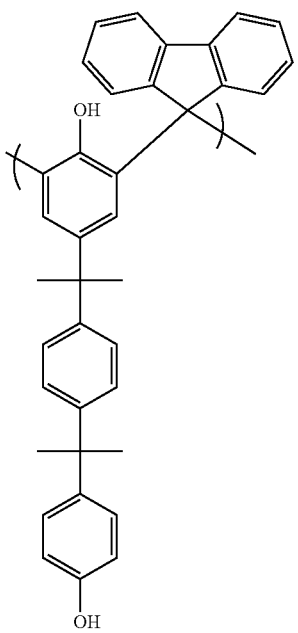
(1-32)
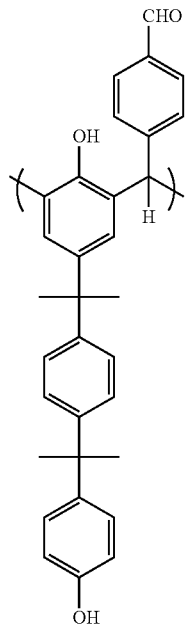
(1-34)

(1-35)
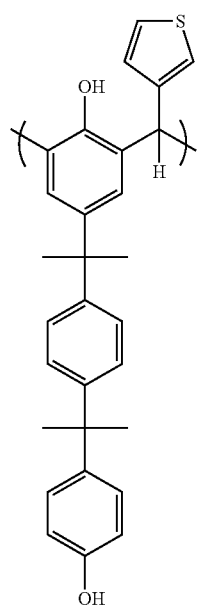
(1-36)
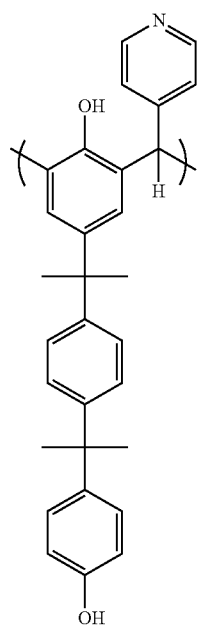
(1-37)
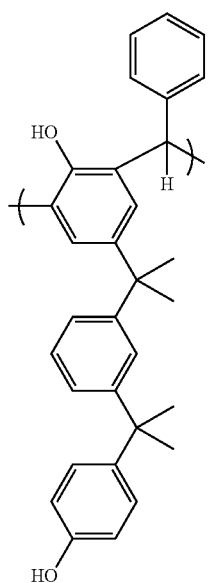
(1-38)
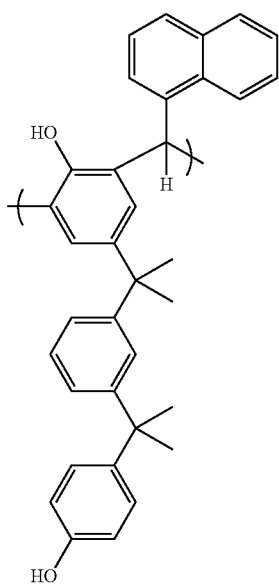

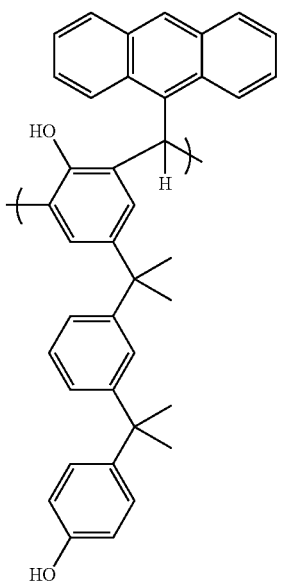
(1-39)
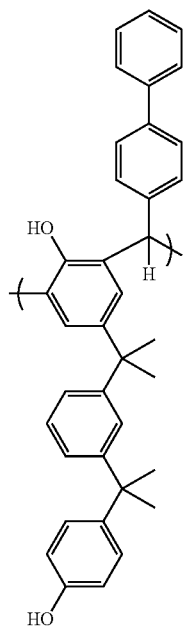
(1-41)
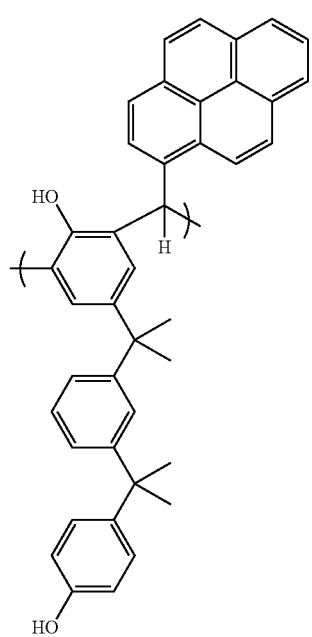
(1-40)
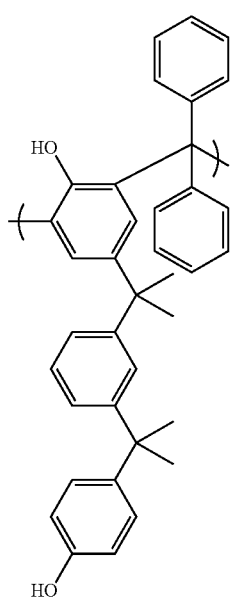
(1-42)

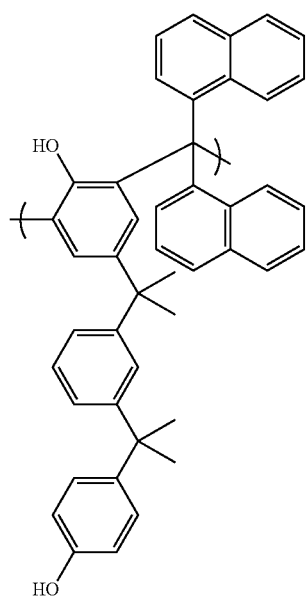
(1-43)
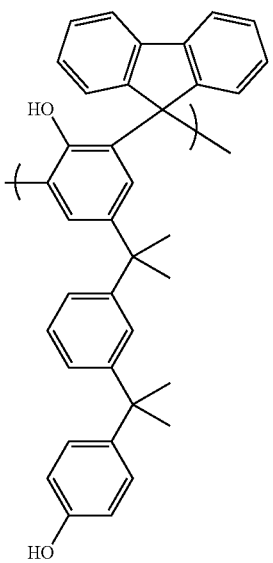
(1-44)
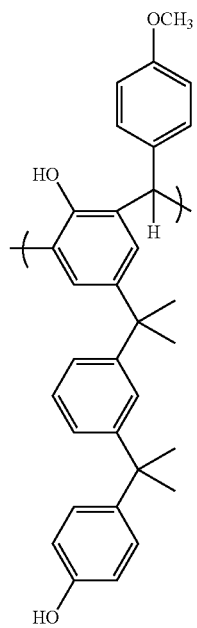
(1-45)
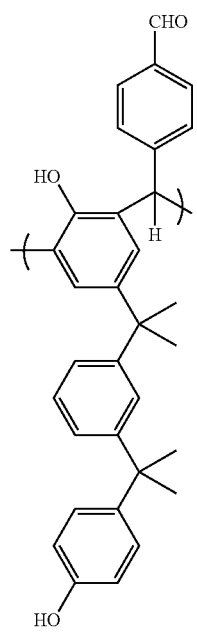
(1-46)

(1-47)

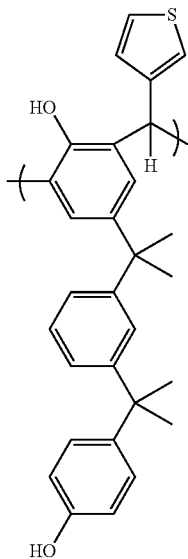

(1-48)

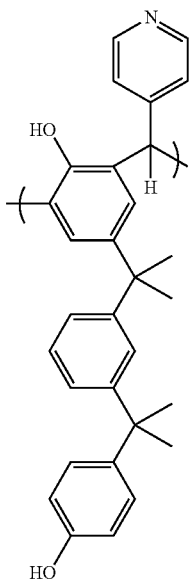

For example, the polymer contained in the resist underlayer film forming composition of the present invention has a weight average molecular weight of 1,000 to 50,000 in terms of standard polystyrene.

The polymer is synthesized by a polymerization reaction of a bisphenol compound having two hydroxyphenyl groups with an aromatic aldehyde or an aromatic ketone in the presence of an acid catalyst such as a sulfonic acid compound. Examples of the bisphenol compound include 1,3-bis[2-(4-hydroxyphenyl)-2-propyl]benzene, and 1,4-bis[2-(4-hydroxyphenyl)-2-propyl]benzene. Examples of the aromatic aldehyde include benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, acetoxybenzaldehyde, 1-pyrenecarboxaldehyde, and anisaldehyde. Instead of the aromatic aldehyde, for example, an aldehyde having a heterocyclic ring such as furfural, pyridinecarboxaldehyde, and thiophenecarboxaldehyde may be used. The aromatic ketone is diaryl ketones. Examples thereof include diphenyl ketone, phenyl naphthyl ketone, dinaphtyl ketone, phenyl tolyl ketone, ditolyl ketone, and 9-fluorenone. The preparation ratio of the bisphenol compound to the aromatic aldehyde or the aromatic ketone is, for example, 1:1 (by mole). The preparation ratio may be 1:2 (by mole). In this case, the polymer to be synthesized has a structural unit that is not the repeating structural unit of formula (1a) and the repeating structural unit of formula (1b). The bisphenol compound is not limited to one type of compound. Two or more types of bisphenol compounds may be used. The aromatic aldehyde or the aromatic ketone is not limited to one type of compound. Two or more types of aromatic aldehydes or aromatic ketones may be used. For example, as the bisphenol compounds, 1,3-bis[2-(4-hydroxyphenyl)-2-propyl]benzene and 1,4-bis[2-(4-hydroxyphenyl)-2-propyl]benzene may be used, and as the aromatic aldehydes, benzaldehyde and naphthylaldehyde may be used.

The resist underlayer film forming composition of the present invention may further contain a crosslinker. As the crosslinker, a cross-linking compound having at least two crosslink-forming substituents is preferably used. Examples thereof include a melamine-based compound having a cross-link-forming substituent such as methylol group and methoxymethyl group, a substituted urea-based compound, and a phenol-based compound. Specific examples thereof include compounds such as methoxymethylated glycoluril and methoxymethylated melamine. Further examples thereof include tetramethoxymethyl glycoluril, tetrabutoxymethyl glycoluril, and hexamethoxymethyl melamine. Examples of the substituted urea-based compound include tetramethoxymethyl urea, and tetrabutoxymethyl urea. Examples of the phenol-based compound include tetrahydroxymethyl biphenol, tetramethoxymethyl biphenol (TMOM-BP), and tetramethoxymethyl bisphenol.

As the crosslinker, a compound having at least two epoxy groups may be used. Examples of such a compound include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl 3,4-epoxycyclohexanecarboxylate, trimethylolethane triglycidyl ether, bisphenol-A-diglycidyl ether, EPOLEAD (registered trademark) GT-401, GT-403, GT-301, and GT-302, and CELLOXIDE (registered trademark) 2021 and 3000 available from Daicel Corporation, 1001, 1002, 1003, 1004, 1007, 1009, 1010, 828, 807, 152, 154, 180S75, 871, and 872 available from Mitsubishi Chemical Corporation, EPPN201, and 202, and EOCN-102, 103S, 104S, 1020, 1025, and 1027 available from NIPPON KAYAKU Co., Ltd., Denacol (registered trademark) EX-252, EX-611, EX-612, EX-614, EX-622, EX-411, EX-512, EX-522, EX-421, EX-313, EX-314, and EX-321 available from Nagase ChemteX Corporation, CY175, CY177, CY179, CY182, CY184, and CY192 available from BASF Japan Ltd., and EPICLON 200, 400, 7015, 835LV, and 850CRP available from DIC Corporation. As the compound having at least two epoxy groups, an epoxy resin having an amino group may be further used. Examples of such an epoxy resin include YH-434 and YH-434L (available from Tohto Kasei Co., Ltd.).

As the crosslinker, a compound having at least two blocked isocyanate groups may be used. Examples of the compound include TAKENATE (registered trademark) B-830 and B-870N available from Mitsui Chemicals, Inc., and VESTANAT (registered trademark) B1358/100 available from Evonik Degussa GmbH.

As the crosslinker, a compound having at least two vinyl ether groups may be used. Examples of such a compound include bis(4-(vinyloxymethyl)cyclohexylmethyl) glutarate, tri(ethylene glycol) divinyl ether, adipic acid divinyl ester, diethylene glycol divinyl ether, 1,2,4-tris(4-vinyloxybutyl) trimellitate, 1,3,5-tris(4-vinyloxybutyl) trimellitate, bis(4-(vinyloxy)butyl) terephthalate, bis(4-(vinyloxy)butyl) isophthalate, ethylene glycol divinyl ether, 1,4-butanediol divinyl ether, tetramethylene glycol divinyl ether, tetraethylene glycol divinyl ether, neopentylglycol divinyl ether, trimethylolpropane trivinyl ether, trimethylol ethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexane dimethanol divinyl ether. One or a combination of two or more selected from the crosslinkers may be added.

The content of the crosslinker is, for example, 2% by mass to 60% by mass relative to a solid content of the resist underlayer film forming composition of the present invention except for a solvent described below.

The resist underlayer film forming composition of the present invention may further contain an acidic compound. The acidic compound acts as a catalyst for promoting a cross-linking reaction. Examples thereof include sulfonic acid compounds and carboxylic acid compounds such as p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, hydroxybenzoic acid, and inorganic acids such as hydrochloric acid, sulfuric acid, nitric acid, and phosphoric acid. Instead of or with the acidic compound, the resist underlayer film forming composition may contain a thermal acid generator. The thermal acid generator also acts as a catalyst for promoting a cross-linking reaction. Examples thereof include quaternary ammonium salts of trifluoromethanesulfonic acid. One or a combination of two or more selected from the acidic compounds and the thermal acid generators may be added. The content of the acidic compound or the thermal acid generator is, for example, 0.1% by mass to 20% by mass relative to the solid content of the resist underlayer film forming composition of the present invention except for the solvent described below.

The resist underlayer film forming composition of the present invention may further contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop (registered trademark) EF301, EF303, and EF352 (available from Mitsubishi Materials Electronic Chemicals Co., Ltd.), MEGAFACE (registered trademark) F171, F173, R-30, and R-30-N (available from DIC Corporation), Fluorad FC430 and FC431 (available from Sumitomo 3M, Ltd.), AsahiGuard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.). One or a combination of two or more selected from the surfactants may be added. The content of the surfactant is, for example, 0.01% by mass to 5% by mass relative to the solid content of the resist underlayer film forming composition of the present invention except for the solvent described below.

The resist underlayer film forming composition of the present invention can be prepared by dissolving the respective components in an appropriate solvent. The resist underlayer film forming composition can be used in a homogeneous solution state. Examples of the solvent include ethylene glycol monomethyl ether, ethylene glycol monoethyl ether, diethylene glycol monomethyl ether, diethylene glycol monoethyl ether, propylene glycol, propylene glycol monomethyl ether, propylene glycol monopropyl ether, propylene glycol monomethyl ether acetate, propylene glycol propyl ether acetate, methyl cellosolve acetate, ethyl cellosolve acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. One type of the organic solvent may be used, or two or more types thereof may be used in combination. The ratio of the solid content of the composition except for the organic solvent is, for example, 0.5% by mass to 30% by mass, and preferably 0.8% by mass to 15% by mass.

The step of applying the resist underlayer film forming composition of the present invention to a surface having steps, concave portions, and/or convex portions followed by baking is carried out by applying the composition to a substrate having steps, concave portions, and/or convex portions on a surface (e.g., a silicon wafer having a wiring and another structure, which may be coated with a silicon oxide film, a silicon nitride film, a silicon nitride oxide film, or a film of metal such as aluminum and tungsten) by an appropriate coating method such as a spinner and a coater, followed by baking by a heating means such as a hot plate. A baking condition is appropriately selected from a baking temperature of 100° C. to 400° C. and a baking time of 0.3 minutes to 10 minutes.

On a first resist underlayer film formed in the aforementioned step, an organopolysiloxane film is formed as a second resist underlayer film, and a resist pattern is formed on the second resist underlayer film. In the step of forming the resist pattern, exposure is carried out through a mask (reticle) for forming a predetermined pattern or by direct drawing. For example, a g-line, an i-line, a KrF excimer laser, an ArF excimer laser, EUV, or an electron beam can be used as an exposure light source. After exposure, post exposure bake is carried out, if necessary. After then, development is carried out using a developer (e.g., 2.38% by mass tetramethylammonium hydroxide aqueous solution), and the used developer is removed by rinsing with a rinse liquid or pure water. Subsequently, post baking is carried out to dry the resist pattern and enhance the adhesion between the resist pattern and a base.

The etching step after formation of the resist pattern is carried out by dry etching. Examples of an etching gas used in dry etching for the second resist underlayer film (organopolysiloxane film) include $CHF_3$, $CF_4$, and $C_2F_6$. Examples of an etching gas used in dry etching for the first resist underlayer film formed from the resist underlayer film forming composition of the present invention include $O_2$, $N_2O$, and $NO_2$. Examples of an etching gas used in dry etching for the surface having steps or concave portions and/or convex portions include $CHF_3$, $CF_4$, and $C_2F_6$. In the gases, a mixture of argon, nitrogen, or carbon dioxide may be used.

Hereinafter, the present invention will be described with reference to Synthesis Examples and Examples, but the present invention is not especially limited to the following description.

EXAMPLES

Weight average molecular weights and degree of distribution shown in the following Synthesis Examples 1 and 2 and Comparative Synthesis Examples 1 and 2 are based on results measured by gel permeation chromatography (hereinafter abbreviated as GPC in the specification). In the measurement, a GPC device manufactured by TOSOH CORPORATION was used. Measurement conditions are as follows.
GPC Column: TSK gel Super Multipore (registered trademark) Hz-N (TOSOH CORPORATION)
Column temperature: 40° C.
Solvent: tetrahydrofuran (THF)
Flow rate: 0.35 mL/min
Standard sample: polystyrene (TOSOH CORPORATION)

Synthesis Example 1

In a 300-mL four-neck flask, 1,3-bis[2-(4-hydroxyphenyl)-2-propyl]benzene (10.00 g, 0.0289 mol, available from Tokyo Chemical Industry Co., Ltd.), 1-pyrenecarboxaldehyde (6.646 g, 0.0289 mol, available from Aldrich), and methanesulfonic acid (0.5548 g, 0.0058 mol, available from Tokyo Chemical Industry Co., Ltd.) were placed under nitrogen. Further, propylene glycol monomethyl ether (7.74 g, available from Kanto Chemical Co., Inc.) and propylene glycol monomethyl ether acetate (18.06 g, available from Kanto Chemical Co., Inc.) were added. The mixture in the four-neck flask was stirred. The temperature was raised to 120° C. to dissolve the mixture, and polymerization was started. After 24 hours, the resultant was allowed to stand and cool to room temperature. In methanol (500 g, available from Kanto Chemical Co., Inc.), reprecipitation was caused. The obtained precipitate was collected by filtration and dried at 50° C. for 10 hours by a reduced-pressure dryer, to obtain 10.82 g of target polymer (hereinafter abbreviated as BPM-Py in the specification). The weight average molecular weight Mw of BPM-Py measured by GPC in terms of polystyrene was 6,300, and the degree of distribution Mw/Mn (wherein Mn was the number average molecular weight) thereof was 1.90.

Synthesis Example 2

In a 300-mL four-neck flask, 1,4-bis[2-(4-hydroxyphenyl)-2-propyl]benzene (10.00 g, 0.0289 mol, available from Tokyo Chemical Industry Co., Ltd.), 1-pyrenecarboxaldehyde (6.646 g, 0.0289 mol, available from Aldrich), and methanesulfonic acid (0.5548 g, 0.0058 mol, available from Tokyo Chemical Industry Co., Ltd.) were placed under nitrogen. Further, propylene glycol monomethyl ether (7.74 g, available from Kanto Chemical Co., Inc.) and propylene glycol monomethyl ether acetate (18.06 g, available from Kanto Chemical Co., Inc.) were added. The mixture in the four-neck flask was stirred. The temperature was raised to 120° C. to dissolve the mixture, and polymerization was started. After 24 hours, the resultant was allowed to stand and cool to room temperature. In methanol (500 g, available from Kanto Chemical Co., Inc.), reprecipitation was caused. The obtained precipitate was collected by filtration and dried at 50° C. for 10 hours by a reduced-pressure dryer, to obtain 9.16 g of target polymer (hereinafter abbreviated as BPP-Py in the specification). The weight average molecular weight Mw of BPP-Py measured by GPC in terms of polystyrene was 2,900 and the degree of distribution Mw/Mn thereof was 2.10.

Comparative Synthesis Example 1

In a 1,000-mL four-neck flask, 2,2'-biphenol (70.00 g, 0.3759 mol, available from Tokyo Chemical Industry Co., Ltd.), 1-pyrenecarboxaldehyde (86.559 g, 0.3759 mol, available from Aldrich), and methanesulfonic acid (10.8389 g, 0.1126 mol, available from Tokyo Chemical Industry Co., Ltd.) were placed under nitrogen. Further, propylene glycol monomethyl ether (167.40 g, available from Kanto Chemical Co., Inc.) was added. The mixture in the four-neck flask was stirred. The temperature was raised to 120° C. to dissolve the mixture, and polymerization was started. After 24 hours, the resultant was allowed to stand and cool to room temperature. In methanol (3,000 g, available from Kanto Chemical Co., Inc.), reprecipitation was caused. The obtained precipitate was collected by filtration and dried at 50° C. for 10 hours by a reduced-pressure dryer, to obtain 84.1 g of polymer having a structural unit of the following formula (3) (hereinafter abbreviated as 2,2'-BPOH-Py in the specification). The weight average molecular weight Mw of 2,2'-BPOH-Py measured by GPC in terms of polystyrene was 1,400 and the degree of distribution Mw/Mn thereof was 1.49.

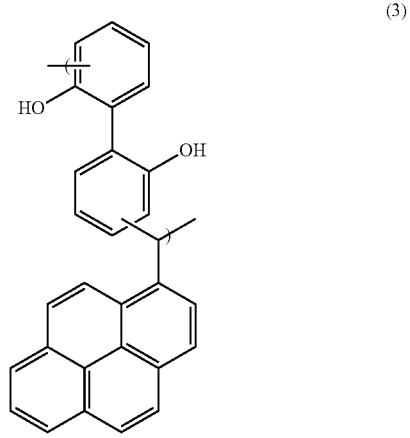

(3)

Comparative Synthesis Example 2

In a 100-mL four-neck flask, carbazole (6.69 g, 0.040 mol, available from Tokyo Chemical Industry Co., Ltd.), 9-fluorenone (7.28 g, 0.040 mol, available from Tokyo Chemical Industry Co., Ltd.), and para-toluenesulfonic acid monohydrate (0.76 g, 0.0040 mol, available from Tokyo Chemical Industry Co., Ltd.) were placed under nitrogen. Further, 1,4-dioxane (6.69 g, available from Kanto Chemical Co., Inc.) was added. The mixture in the four-neck flask was stirred. The temperature was raised to 100° C. to dissolve the mixture, and polymerization was started. After 24 hours, the resultant was allowed to stand and cool to 60° C., and diluted with chloroform (34 g, available from Kanto Chemical Co., Inc.). In methanol (168 g, available from Kanto Chemical Co., Inc.), reprecipitation was caused. The obtained precipitate was collected by filtration and dried at 80° C. for 24 hours by a reduced-pressure dryer, to obtain 9.37 g of target polymer having a structural unit of the following formula (4) (hereinafter abbreviated as PCzFL in the specification). The weight average molecular weight Mw of PCzFL measured by GPC in terms of polystyrene was 2,800 and the degree of distribution Mw/Mn thereof was 1.77.

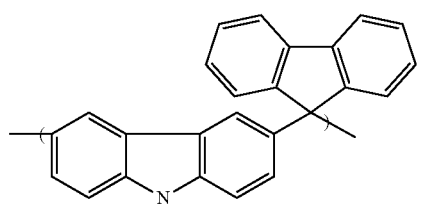

(4)

Example 1

Into 20 g of the polymer obtained in Synthesis Example 1, 0.06 g of MEGAFACE R-30-N (available from DIC Corporation) as a surfactant was mixed. The mixture was dissolved in 24 g of propylene glycol monomethyl ether and 66 g of propylene glycol monomethyl ether acetate to obtain a solution. The solution was subjected to filtration through a polyethylene microfilter with a pore diameter of 0.10 μm, and then through a polyethylene microfilter with a pore diameter of 0.05 μm to prepare a resist underlayer film forming composition for a lithography process.

Example 2

Into 20 g of the polymer obtained in Synthesis Example 2, 0.06 g of MEGAFACE R-30-N (available from DIC Corporation) as a surfactant was mixed. The mixture was dissolved in 24 g of propylene glycol monomethyl ether and 66 g of propylene glycol monomethyl ether acetate to obtain a solution. The solution was subjected to filtration through a polyethylene microfilter with a pore diameter of 0.10 μm, and then through a polyethylene microfilter with a pore diameter of 0.05 μm to prepare a resist underlayer film forming composition for a lithography process.

Comparative Example 1

Into 20 g of the polymer obtained in Comparative Synthesis Example 1, 0.06 g of MEGAFACE R-30 (available from DIC Corporation) as a surfactant was mixed. The mixture was dissolved in 24 g of propylene glycol monomethyl ether and 66 g of propylene glycol monomethyl ether acetate to obtain a solution. The solution was then subjected to filtration through a polyethylene microfilter with a pore diameter of 0.10 μm, and then through a polyethylene microfilter with a pore diameter of 0.05 μm to prepare a resist underlayer film forming composition for a lithography process.

Comparative Example 2

Into 20 g of the polymer obtained in Comparative Synthesis Example 2, 0.06 g of MEGAFACE R-30 (available from DIC Corporation) as a surfactant was mixed. The mixture was dissolved in 80 g of propylene glycol monomethyl ether acetate to obtain a solution. The solution was then subjected to filtration through a polyethylene microfilter with a pore diameter of 0.10 μm, and then through a polyethylene microfilter with a pore diameter of 0.05 μm to prepare a resist underlayer film forming composition for a lithography process.

(Elution Test into Photoresist Solvent)

The resist underlayer film forming composition prepared in each of Examples 1 and 2 and Comparative Examples 1 and 2 was applied to a silicon wafer by a spin coater.

The silicon wafers were each baked at 400° C. for 2 minutes on a hot plate to form a resist underlayer film (thickness: 0.25 μm). The resist underlayer films were each immersed in a solvent used for a resist that was ethyl lactate, propylene glycol monomethyl ether, propylene glycol monomethyl ether acetate, or cyclohexanone. It was confirmed that the resist underlayer films were each insoluble in each solvent.

(Measurement of Dry Etching Rate)

An etcher and an etching gas used in measurement of dry etching rate are as follows.

Etcher: ES401 (available from NIPPON SCIENTIFIC Co., Ltd)

Etching gas: $CF_4$

The resist underlayer film forming composition prepared in each of Examples 1 and 2 and Comparative Examples 1 and 2 was applied to a silicon wafer by a spin coater. The silicon wafers were each baked at 400° C. for 2 minutes on a hot plate to form a resist underlayer film (thickness: 0.25 μm). The dry etching rate of each of the resist underlayer films was measured using a $CF_4$ gas as an etching gas. Table 1 shows results of a decreased film thickness per unit time (one minute) of the resist underlayer film formed from the resist underlayer film forming composition prepared in each of Examples 1 and 2 and Comparative Examples 1 and 2 that was calculated as the dry etching rate. A lower dry etching rate shows higher resistance to etching using a $CF_4$ gas.

TABLE 1

| | Dry etching rate |
|---|---|
| | Decrease in film thickness per unit time |
| Example 1 | 73.4 nm/min |
| Example 2 | 74.5 nm/min |
| Comparative Example 1 | 76.6 nm/min |
| Comparative Example 2 | 84.0 nm/min |

(Embedding Test into Hole Wafer)

The resist underlayer film forming composition prepared in each of Examples 1 and 2 and Comparative Example 2 was applied to a hole wafer by a spin coater. The hole wafers were each baked at 400° C. for 2 minutes on a hot plate to form a resist underlayer film (thickness of a portion where a hole pattern was not formed: 0.25 μm). As the hole wafer, a wafer having a pattern of hole with a diameter of 100 nm and a height of 400 nm was used. FIGS. 1 and 2 are cross-sectional SEM photographs in which a cross section of each hole wafer after the resist underlayer film forming composition prepared in each of Examples 1 and 2 was applied and baked as described above was observed by a scanning electron microscope (SEM). As seen from the cross-sectional SEM photographs of FIGS. 1 and 2, the inside of the hole was sufficiently filled with the resist underlayer film. On the other hand, FIG. 3 is a cross-sectional SEM photograph in which the cross section of the hole wafer after the resist underlayer film forming composition prepared in Comparative Example 2 was applied and baked as described above was observed by a scanning electron microscope. As seen from the cross-sectional SEM photograph of FIG. 3, there was a cavity in a part of inside of the hole.

(Chemical Solution Mixing Test)

The resist underlayer film forming composition prepared in each of Examples 1 and 2 and Comparative Examples 1 and 2 and methyl 2-hydroxyisobutyrate were mixed at a mass ratio (9:1). After mixing, the presence or absence of a deposition was checked. The results are shown in Table 2. Dissolution of the resist underlayer film forming compositions prepared in Examples 1 and 2 in methyl 2-hydroxyisobutyrate was confirmed. The resist underlayer film forming composition in each of Comparative Examples 1 and 2 was mixed with methyl 2-hydroxyisobutyrate. As a result, a deposition of the resist underlayer film forming composition was produced.

TABLE 2

Chemical solution mixing test

| Resist underlayer film | Results of mixing test (methyl 2-hydroxyisobutyrate) |
|---|---|
| Example 1 | Not disposed |
| Example 2 | Not disposed |
| Comparative Example 1 | Disposed |
| Comparative Example 2 | Disposed |

The invention claimed is:

1. A resist underlayer film forming composition comprising a polymer having a repeating structural unit of formula (1a) and/or (1b):

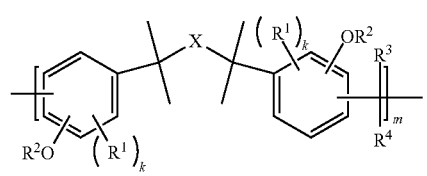

(1a)

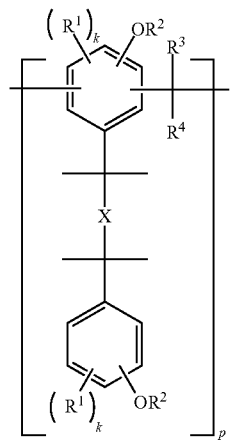

(1b)

[wherein two $R^1$s are each independently a $C_{1-10}$ alkyl group, a $C_{2-6}$ alkenyl group, an aromatic hydrocarbon group, a halogen atom, a nitro group, or an amino group, two $R^2$s are each independently a hydrogen atom, a $C_{1-10}$ alkyl group, a $C_{2-6}$ alkenyl group, an acetal group, an acyl group, or a glycidyl group, $R^3$ is an aromatic hydrocarbon group optionally having a substituent or a heterocyclic group, $R^4$ is a hydrogen atom, a phenyl group, or a naphthyl group, when $R^3$ and $R^4$ bonded to the same carbon atom are each a phenyl group, $R^3$ and $R^4$ are optionally bonded to each other to form a fluorene ring, two ks are each independently 0 or 1, m is an integer of 3 to 500, p is an integer of 3 to 500, X is a benzene ring, and two —$C(CH_3)_2$— groups bonded to the benzene ring are in a meta position or a para position], and a solvent.

2. The resist underlayer film forming composition according to claim 1, wherein the polymer is a product obtained by a polymerization reaction of at least one type of bisphenol compound with at least one type of aromatic aldehyde or aromatic ketone.

3. The resist underlayer film forming composition according to claim 1, wherein the aromatic hydrocarbon group of $R^3$ is a phenyl group, a naphthyl group, an anthryl group, or a pyrenyl group.

4. The resist underlayer film forming composition according to claim 1, further comprising at least one of a cross-linker, an acidic compound, a thermal acid generator, and a surfactant.

5. The A method for producing a semiconductor device comprising steps of: applying the resist underlayer film forming composition according to claim 1 to a surface of a substrate having steps, concave portions, and/or convex portions followed by baking, to form a first resist underlayer film; forming an organopolysiloxane film as a second resist underlayer film on the first resist underlayer film; forming a resist pattern on the second resist underlayer film; etching the second resist underlayer film using the resist pattern as a mask; etching the first resist underlayer film using the pattern of the etched second resist underlayer film as a mask; and etching the surface having steps, concave portions, and/or convex portions using the pattern of the etched first resist underlayer film as a mask.

6. The method for producing a semiconductor device according to claim 5, wherein in the step of forming the first resist underlayer film and/or the step of forming the second resist underlayer film, the substrate having the steps, concave portions, and/or convex portions is further subjected to a pre-wetting process, edge rinsing, and back rinsing using methyl 2-hydroxyisobutyrate.

\* \* \* \* \*